(12) United States Patent
Fu et al.

(10) Patent No.: US 12,025,666 B2
(45) Date of Patent: Jul. 2, 2024

(54) DETECTION CIRCUIT AND DETECTION METHOD OF ELECTRICAL CONTROL DEVICE, AND ELECTRIC VEHICLE

(71) Applicant: CONTEMPORARY AMPEREX TECHNOLOGY CO., LIMITED, Ningde (CN)

(72) Inventors: Yanhui Fu, Ningde (CN); Le Chu, Ningde (CN); Changjian Liu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 284 days.

(21) Appl. No.: 17/585,326

(22) Filed: Jan. 26, 2022

(65) Prior Publication Data

US 2022/0229112 A1 Jul. 21, 2022

Related U.S. Application Data

(63) Continuation of application No. PCT/CN2020/110650, filed on Aug. 22, 2020.

(30) Foreign Application Priority Data

Aug. 30, 2019 (CN) .......................... 201910816912.9

(51) Int. Cl.
*G01R 31/327* (2006.01)
*G01R 31/00* (2006.01)
(Continued)

(52) U.S. Cl.
CPC ....... *G01R 31/3278* (2013.01); *G01R 31/006* (2013.01); *G01R 31/52* (2020.01); *G05B 23/0213* (2013.01)

(58) Field of Classification Search
CPC .. G01R 31/3278; G01R 31/006; G01R 31/52; G01R 31/3333; G01R 31/2829; G01R 31/282; G05B 23/0213
(Continued)

(56) References Cited

U.S. PATENT DOCUMENTS

2013/0058178 A1\* 3/2013 Lai ................... G11C 29/50012
365/201
2017/0150568 A1\* 5/2017 Hayashi ............... H05B 39/048
(Continued)

FOREIGN PATENT DOCUMENTS

CN 104049166 A 9/2014
CN 204666783 U 9/2015
(Continued)

OTHER PUBLICATIONS

Lu, Shourong, "Circuit Analysis and Methods of Fault-detection for Automobile Starting-system", 3 pages.
(Continued)

*Primary Examiner* — Tung X Nguyen
*Assistant Examiner* — Robert P Alejnikov, Jr.
(74) *Attorney, Agent, or Firm* — Kilpatrick Townsend & Stockton LLP

(57) ABSTRACT

This application relates to the technical field of electronics, and discloses a detection circuit and a detection method of an electrical control device, and an electric vehicle. In some embodiments of this application, the detection circuit includes a drive circuit configured to detect an electrical control device. The drive circuit includes a drive power module and a low-side switch unit. The detection circuit includes: a first detection module, a second detection module, and a control module. The control module is configured to obtain an electrical signal at a third end of the first detection module, and/or an electrical signal at a second end
(Continued)

of the second detection module; and determine, based on the electrical signal at the third end of the first detection module, and/or the electrical signal at the second end of the second detection module, whether the drive circuit of the electrical control device is faulty.

18 Claims, 17 Drawing Sheets

(51) Int. Cl.
  *G01R 31/52* (2020.01)
  *G05B 23/02* (2006.01)
(58) Field of Classification Search
  USPC .......................................................... 324/418
  See application file for complete search history.

(56) References Cited

U.S. PATENT DOCUMENTS

2019/0118668 A1* 4/2019 Dan ........................ B60L 50/66
2020/0166574 A1* 5/2020 Lee .................. G01R 19/16519

FOREIGN PATENT DOCUMENTS

| | | | | |
|---|---|---|---|---|
| CN | 105490255 | A | 4/2016 | |
| CN | 107305356 | A | 10/2017 | |
| CN | 107422257 | A | 12/2017 | |
| CN | 207232324 | U | 4/2018 | |
| CN | 108958230 | A | 12/2018 | |
| CN | 109254245 | A * | 1/2019 | ........... G01R 31/327 |
| CN | 109254245 | A | 1/2019 | |
| CN | 109541457 | A * | 3/2019 | ......... G01R 31/3275 |
| CN | 109541457 | A | 3/2019 | |
| CN | 109581192 | A | 4/2019 | |
| CN | 209296880 | U | 8/2019 | |
| CN | 209297880 | U * | 8/2019 | |
| EP | 3699014 | A1 * | 8/2020 | ........... B60L 3/0046 |
| JP | 2013234885 | A | 11/2013 | |
| KR | 101102603 | B1 | 1/2012 | |
| KR | 20160079507 | A | 7/2016 | |
| WO | 2018035932 | A1 | 3/2018 | |
| WO | WO2019151781 | A1 | 8/2019 | |

OTHER PUBLICATIONS

The first Office Action received in the corresponding Chinese application 201910816912.9, mailed Nov. 15, 2023.
Contemporary Amperex Technology Co., Limited, International Search Report and Written Opinion, PCT/CN2020/110650, Nov. 18, 2020, 16 pgs.

\* cited by examiner

DETECTION CIRCUIT AND DETECTION METHOD OF ELECTRICAL CONTROL DEVICE, AND ELECTRIC VEHICLE

CROSS-REFERENCE TO RELATED APPLICATIONS

This application is a continuation application of PCT Patent Application No. PCT/CN2020/110650, entitled "DETECTION CIRCUIT AND DETECTION METHOD FOR ELECTRIC CONTROL DEVICE, AND ELECTRIC CAR" filed on Aug. 22, 2020, which claims priority to Chinese Patent Application No. 201910816912.9, filed with the State Intellectual Property Office of the People's Republic of China on Aug. 30, 2019, and entitled "DETECTION CIRCUIT AND DETECTION METHOD OF ELECTRICAL CONTROL DEVICE", all of which are incorporated herein by reference in their entirety.

TECHNICAL FIELD

Embodiments of this application relate to the technical field of electronics, and in particular, to a detection circuit and a detection method of an electrical control device, and an electric vehicle.

BACKGROUND

Currently, electric vehicles in place of fuel vehicles have become an evolution trend of the automotive industry. Because intrinsic power of a motor of an electric vehicle is relatively high, a currently available battery pack is basically a high-voltage low-current solution or a low-voltage and high-current solution. However, the voltage of the battery pack, even if relatively low, is still far higher than a safe voltage. Therefore, a controller controls a high-voltage loop indirectly by using a relay. Nevertheless, the relay is a mechanical switch after all, and may face an aging problem after a long time of work. This further leads to circumstances of failure of the relay or a wiring harness connected to the relay. Such circumstances exert a significant impact on safe operation of the vehicle, and diagnosis of the relay becomes very important.

However, at least the following problems are found in the related technology: a fault detection solution for a drive circuit of the relay is currently lacking.

It needs to be noted that the information disclosed in the background technology section above is merely intended for ease of understanding the background of the present disclosure, and therefore, may include information that does not constitute a related technology known to a person of ordinary skill in the art.

SUMMARY

An objective of embodiments of this application is to provide a detection circuit and a detection method of an electrical control device, and an electric vehicle to perform fault diagnosis on a drive circuit of the electrical control device.

To achieve the foregoing technical objective, an embodiment of this application provides a detection circuit of an electrical control device. The detection circuit is configured to detect a drive circuit of the electrical control device. The drive circuit of the electrical control device includes a drive power module and a low-side switch unit. The drive power module is connected to a first end of the electrical control device. A second end of the electrical control device is connected to a first end of the low-side switch unit. A second end of the low-side switch unit is grounded. The detection circuit includes: a first detection module, a second detection module, and a control module. A first end of the first detection module is connected to the first end of the electrical control device. A second end of the first detection module is connected to the second end of the electrical control device. A third end of the first detection module is connected to the control module. A first end of the second detection module is connected to the second end of the electrical control device. A second end of the second detection module is connected to the control module. A third end of the second detection module is grounded. The control module is configured to: obtain an electrical signal at the third end of the first detection module and/or an electrical signal at the second end of the second detection module, and determine, based on the electrical signal at the third end of the first detection module and/or the electrical signal at the second end of the second detection module, whether the drive circuit of the electrical control device is faulty.

An embodiment of this application further provides a detection method of an electrical control device. The detection method is applied to a control module in the detection circuit of an electrical control device mentioned in the preceding embodiment. The detection method includes: obtaining an electrical signal at a third end of a first detection module and/or an electrical signal at a second end of a second detection module; and determining, based on the electrical signal at the third end of the first detection module and/or the electrical signal at the second end of the second detection module whether a drive circuit of the electrical control device is faulty.

An embodiment of this application further provides an electric vehicle, including an electrochemical device, an electrical control device, and any detection circuit described above.

In contrast with existing technologies, in the embodiments of this application, the electrically conductive state of a normal-state drive circuit of the electrical control device is different from the electrically conductive state of a faulty-state drive circuit of the electrical control device. A different voltage at the first end of the electrical control device in the drive circuit and/or a different voltage at the second end of the electrical control device lead to a different conductive state of an internal circuit in the first detection module and the second detection module. Therefore, the third end of the first detection module and/or the second end of the second detection module may be detected to determine whether the drive circuit is faulty. In this way, the fault of the drive circuit of the electrical control device can be detected.

In addition, the detection circuit further includes a switch module. The switch module is serial-connected between the first end of the first detection module and the first end of the electrical control device, or, the switch module is serial-connected between the second end of the first detection module and the second end of the electrical control device. The switch module is controlled by the control module. In this implementation, the on and off states of the first detection module can be controlled by the switch module to avoid unnecessary power loss.

In addition, the first detection module includes a first power submodule, a first current-limiting submodule, and a switch element. A first end of the switch element serves as the first end of the first detection module, a second end of the switch element serves as the second end of the first detection module. A third end of the switch element is connected to the first power submodule by the first current-limiting submodule, a fourth end of the switch element is grounded, and the third end of the switch element serves as the third end of the first detection module. Alternatively, a third end of the switch element is connected to the first power submodule, a fourth end of the switch element is connected to a first end of the first current-limiting submodule, a second end of the first current-limiting submodule is grounded, and the first end of the first current-limiting submodule serves as the third end of the first detection module. When a current flows from the first end of the switch element to the second end of the switch element, an electrically conductive path is formed between the third end of the switch element and the fourth end of the switch element. This implementation can avoid damage to a device in the first detection module caused by an excessive current flowing through the first detection module.

In addition, the detection circuit further includes a filter module. The third end of the first detection module is connected to the control module by the filter module.

In addition, the first detection module includes: a first power submodule, a filter submodule, a first current-limiting submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module.

In addition, the detection circuit further includes a first current-limiting module. The first end of the first detection module is connected to the first end of the electrical control device by the first current-limiting module. This implementation can avoid damage to a device in the first detection module caused by an excessive current flowing through the first detection module.

In addition, the switch element is any one of a photocoupler, a relay, a reed switch or an optical field effect transistor.

In addition, the second detection module includes a second power submodule, a second current-limiting submodule, and a switch transistor. The second power submodule is connected to a first end of the switch transistor by the second current-limiting submodule. A second end of the switch transistor serves as the third end of the second detection module. A control end of the switch transistor serves as the first end of the second detection module. The first end of the switch transistor serves as the second end of the second detection module.

In addition, the detection circuit further includes a second current-limiting module. A second end of the second detection module is connected to the control module by the second current-limiting module.

In addition, the detection circuit further includes a freewheeling module. The freewheeling module is parallel-connected to the electrical control device. This implementation can avoid a circumstance that an induced electromotive force generated by the electrical control device burns out a device in the circuit.

In addition, the freewheeling module includes a transient voltage suppressor.

In addition, the control module includes a processing submodule and a first multiplexing submodule. The processing submodule is connected to the third end of the first detection module and the second end of the second detection module by the first multiplexing submodule. In this implementation, a "one-to-many" detection function of a processor port is implemented.

In addition, the control module includes a processing submodule and a second multiplexing submodule. The processing submodule is connected to the low-side switch unit of the electrical control device by the second multiplexing submodule. In this implementation, a "one-to-many" control function of the processor port is implemented.

In addition, when the detection method is applied to a control module in the detection circuit in some embodiments, the "obtaining an electrical signal at a third end of a first detection module and an electrical signal at a second end of a second detection module, and determining, based on the electrical signal at the third end of the first detection module and the electrical signal at the second end of the second detection module, whether a drive circuit of the electrical control device is faulty" specifically includes: obtaining a first electrical signal at the second end of the second detection module in a state in which a low-side switch unit is not enabled; closing the switch module when it is determined that an electrical level of the first electrical signal is not a preset first level, and obtaining a second electrical signal at the third end of the first detection module; and determining a fault type of the drive circuit of the electrical control device based on the second electrical signal.

In addition, the determining a fault type of the drive circuit of the electrical control device based on the second electrical signal specifically includes: determining whether a level of the second electrical signal is a preset second level; determining, if a determining result is that the level of the second electrical signal is the preset second level, that the fault type of the drive circuit of the electrical control device is an open-circuit fault; or determining, if a determining result is that the level of the second electrical signal is not the preset second level, that the fault type of the drive circuit of the electrical control device is a shorted-to-ground fault.

In addition, after closing the switch module, the detection method of an electrical control device further includes: obtaining a third electrical signal at the second end of the second detection module. The determining a fault type of the drive circuit of the electrical control device based on the second electrical signal specifically includes: determining, if it is determined that a level of the second electrical signal is a preset second level, and a level of the third electrical signal is the first level, that the fault type of the drive circuit of the electrical control device is an open-circuit fault; or determining, if it is determined that a level of the second electrical signal is not a preset second level, and a level of the third electrical signal is not the first level, that the fault type of the drive circuit of the electrical control device is a shorted-to-ground fault.

In addition, the "obtaining an electrical signal at a third end of a first detection module, and determining, based on the electrical signal at the third end of the first detection module, whether a drive circuit of the electrical control device is faulty" specifically includes: monitoring the electrical signal at the third end of the first detection module in real time in a state in which the low-side switch unit is enabled and the switch module is closed; and determining, if it is determined that a level of the electrical signal at the third end of the first detection module is not a preset second level, that a power loss fault occurs in the drive circuit of the electrical control device.

In addition, when the detection method is applied to a control module in the detection circuit in some embodiments, the "obtaining an electrical signal at a second end of a second detection module, and determining, based on the electrical signal at the second end of the second detection module, whether a drive circuit of the electrical control device is faulty" specifically includes: monitoring the electrical signal at the second end of the second detection module in real time in a state in which a low-side switch unit is enabled and the switch module is turned off; and determining, if it is determined that a level of the electrical signal at the second end of the second detection module is a preset first level, that an open-circuit fault occurs in the low-side switch unit.

BRIEF DESCRIPTION OF DRAWINGS

One or more embodiments are described exemplarily with reference to drawings corresponding to the embodiments. The exemplary description does not constitute any limitation on the embodiments. Components marked with the same reference numeral in the drawings represent similar components. Unless otherwise specified, the drawings do not constitute any scale limitation.

DETAILED DESCRIPTION OF EMBODIMENTS

Figure 1:
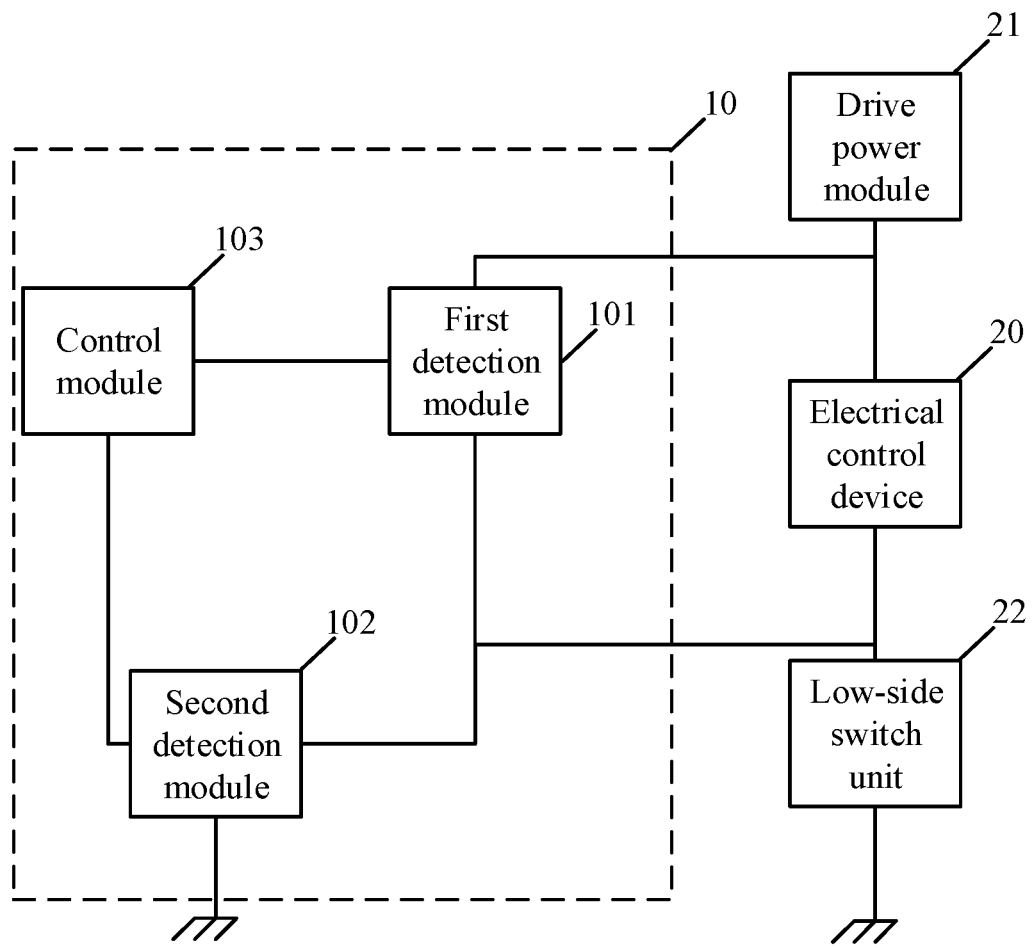
FIG. 1 is a schematic structural diagram of a detection circuit of an electrical control device according to a first embodiment of this application.

To make the objectives, technical solutions, and advantages of this application clearer, the following describes the embodiments of this application in detail with reference to accompanying drawings. However, a person of ordinary skill in the art understands that in each embodiment of this application, many technical details are provided to make readers better understand this application. However, the technical solutions claimed in this application can still be implemented based on variations and modifications of the following embodiments even without the technical details.

The reference numerals assigned to the components herein, such as "first" and "second", are merely used to distinguish the described objects but without indicating any sequential or technical meaning. Unless otherwise specified, "connection" and "concatenation" mentioned in this application include direct and indirect connections (concatenations).

A first embodiment of this application relates to a detection circuit 10 of an electrical control device. The detection circuit 10 is configured to detect a drive circuit of the electrical control device 20. The drive circuit of the electrical control device 20 includes a drive power module 21 and a low-side switch unit 22. The drive power module 21 is connected to a first end of the electrical control device 20. A second end of the electrical control device 20 is connected to a first end of the low-side switch unit 22. A second end of the low-side switch unit 22 is grounded. The electrical control device may be a relay or the like. As shown in FIG. 1, the detection circuit 10 includes: a first detection module 101, a second detection module 102, and a control module 103. A first end of the first detection module 101 is connected to the first end of the electrical control device 20. A second end of the first detection module 101 is connected to the second end of the electrical control device 20. A third end of the first detection module 101 is connected to the control module 103. A first end of the second detection module 102 is connected to the second end of the electrical control device 20. A second end of the second detection module 102 is connected to the control module 103. A third end of the second detection module 102 is grounded. The control module 103 is configured to: obtain an electrical signal of the first detection module 101 and/or an electrical signal at the second end of the second detection module 102, and determine, based on the electrical signal at the third end of the first detection module 101 and/or the electrical signal at the second end of the second detection module 102, whether the drive circuit of the electrical control device 20 is faulty. When the first end of the second detection module 102 is connected to a high level, a level at the second end of the second detection module 102 is a preset first level. When the first end of the second detection module 102 is connected to a low level, the level at the second end of the second detection module 102 is a reverse level of the first level. When a current flows between the first end of the first detection module 101 and the second end of the first detection module 101, a level of an electrical signal at the third end of the first detection module 101 is a preset second level. When no current flows between the first end of the first detection module 101 and the second end of the first detection module 101, the level of the electrical signal at the third end of the first detection module 101 is a reverse level of the preset second level. An electrically conductive loop in a case of a faulty circuit is different from an electrically conductive loop in a case of a normal circuit. The electrical signal at the third end of the first detection module 101 is different from the electrical signal at the second end of the second detection module 102. Therefore, some types of faults can be detected based on the electrical signal at the third end of the first detection module 101 and/or the electrical signal at the second end of the second detection module 102.

For example, if the drive circuit is normal before the low-side switch unit is enabled, a current flows between the first end of the first detection module 101 and the second end of the first detection module 101. In this case, the level of the electrical signal at the third end of the first detection module 101 is a preset second level, the first end of the second detection module 102 is connected to a high level, and the level at the second end of the second detection module 102 is a preset first level. If a shorted-to-ground fault occurs in the drive circuit, no current flows between the first end of the first detection module 101 and the second end of the first detection module 101. In this case, the level of the electrical signal at the third end of the first detection module 101 is a reverse level of the preset second level. When the first end of the second detection module 102 is connected to a low level, the level at the second end of the second detection module 102 is a reverse level of the first level. Therefore, the shorted-to-ground fault in a circuit can be detected based on the first detection module 101 and the second detection module 102.

In an embodiment, a conduction relationship between the first detection module and the electrical control device is controlled by the switch module 104. When the drive circuit needs to be detected by the first detection module, the switch module 104 is closed. When the drive circuit does not need to be detected by the first detection module 101, the switch module 104 is turned off, thereby reducing electrical loss.

Figure 2:
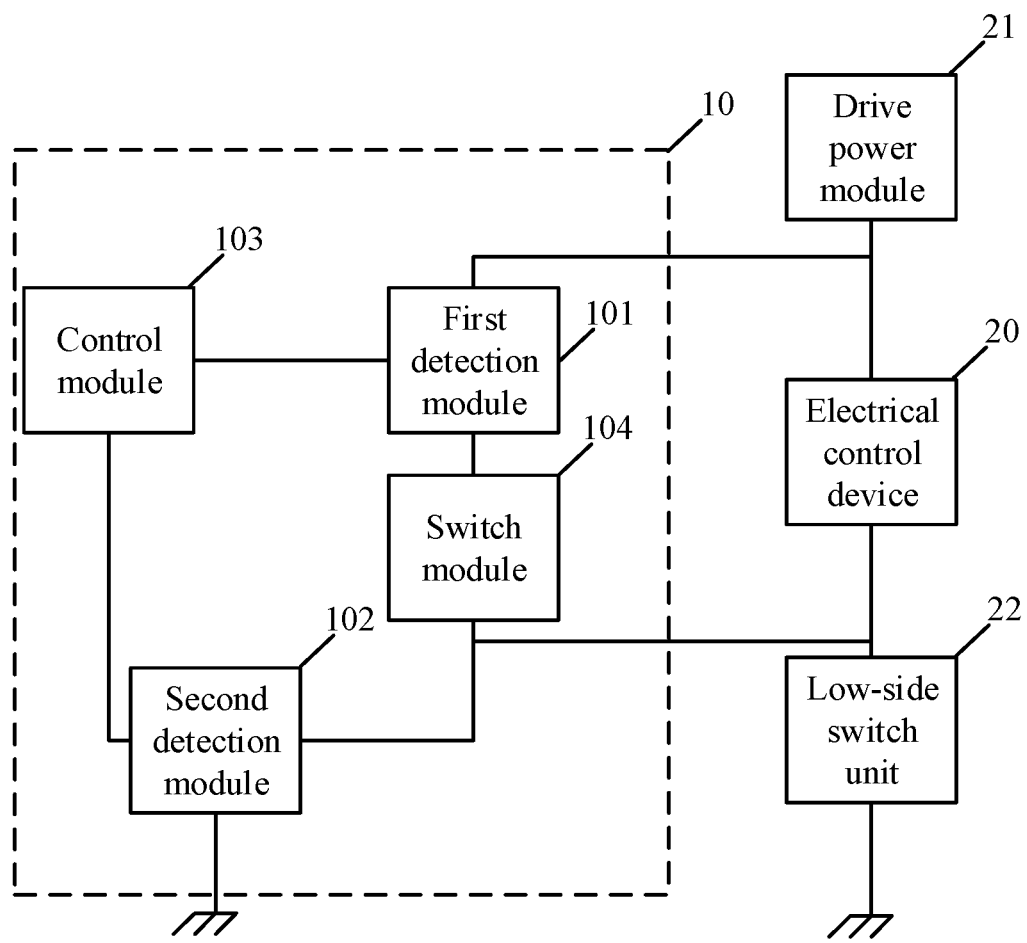
FIG. 2 is a schematic structural diagram of a detection circuit in which a switch module is added according to a first embodiment of this application.

As an example, FIG. 2 shows a detection circuit in which the switch module 104 is added. The detection circuit further includes the switch module 104. The switch module 104 is serial-connected between the second end of the first detection module 101 and the second end of the electrical control device 20. The switch module 104 is controlled by the control module 103.

Figure 3:
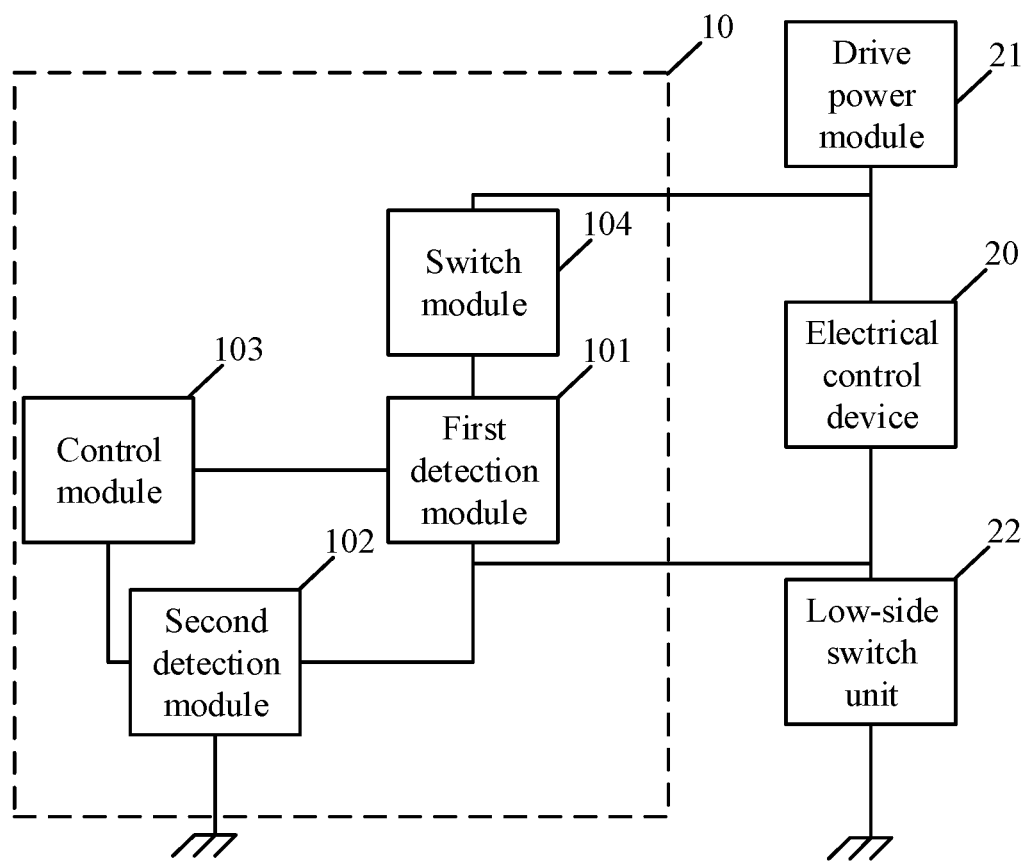
FIG. 3 is a schematic structural diagram of another detection circuit in which a switch module is added according to a first embodiment of this application.

For another example, FIG. 3 shows a detection circuit in which the switch module 104 is added. The switch module 104 is serial-connected between the first end of the first detection module 101 and the first end of the electrical control device 20. The switch module 104 is controlled by the control module 103.

It needs to be noted that in this embodiment, a connection relationship between the switch module 104 and the control module 103 is not shown in FIG. 2 or FIG. 3. However, this does not mean that there is no connection between the control module 103 and the switch module 104. The control module 103 may be connected to the switch module 104 in a wired or wireless manner.

It needs to be noted that the electrical control device may be a relay or another device that uses a low current to control its status. This embodiment does not limit the specific type of the electrical control device.

It needs to be noted that the foregoing description is merely exemplary, but does not constitute any limitation on the technical solutions of this application.

In contrast with existing technologies, in the detection circuit of an electrical control device according to this embodiment, the electrically conductive state of a normal-state drive circuit of the electrical control device is different from the electrically conductive state of a faulty-state drive circuit of the electrical control device. A different voltage at the first end of the electrical control device in the drive circuit and/or a different voltage at the second end of the electrical control device lead to a different conductive state of an internal circuit in the first detection module and the second detection module. Therefore, the third end of the first detection module and/or the second end of the second detection module may be detected to determine whether the drive circuit is faulty. In this way, the fault of the drive circuit of the electrical control device can be detected. Therefore, the control module may obtain an electrical signal at the third end of the first detection module, and determine, based on the electrical signal at the third end of the first detection module, whether the drive circuit of the electrical control device is faulty; or, obtain an electrical signal at the second end of the second detection module, and determine, based on the electrical signal at the second end of the second detection module, whether the drive circuit of the electrical control device is faulty; or, obtain an electrical signal at the third end of the first detection module and an electrical signal at the second end of the second detection module, and determine, based on the electrical signal at the third end of the first detection module and the electrical signal at the second end of the second detection module, whether the drive circuit of the electrical control device is faulty, thereby fulfilling the objective of performing fault detection on the drive circuit of the electrical control device and determining the fault type.

A second embodiment of this application relates to a detection circuit of an electrical control device. The second embodiment exemplifies the circuit structure of the first detection module 101 mentioned in the first embodiment. The content that has been described in the first embodiment will be omitted here.

Figure 4:
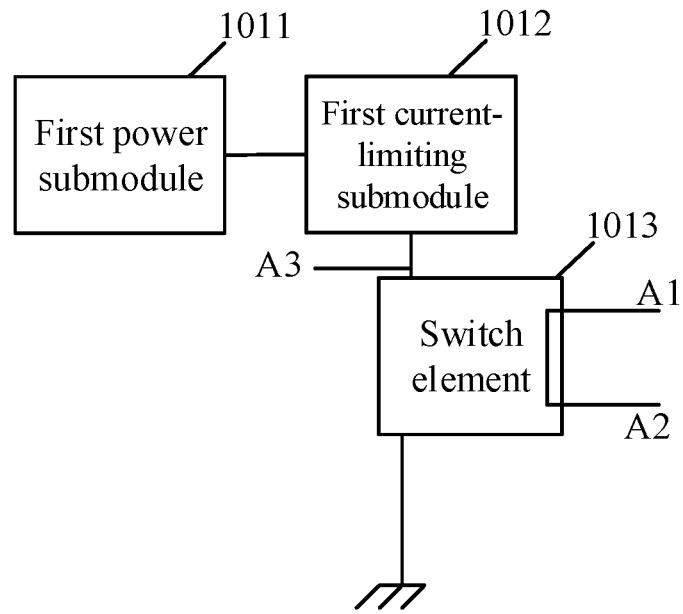
FIG. 4 is a schematic structural diagram of a first detection module according to a second embodiment of this application.

Specifically, as shown in FIG. 4, in this embodiment, the first detection module 101 includes a first power submodule 1011, a first current-limiting submodule 1012, and a switch element 1013. A first end of the switch element 1013 serves as the first end A1 of the first detection module 101. A second end of the switch element 1013 serves as the second end A2 of the first detection module 101. A third end of the switch element 1013 is connected to the first power submodule 1011 by the first current-limiting submodule 1012. A fourth end of the switch element 1013 is grounded. The third end of the switch element 1013 serves as the third end A3 of the first detection module 101. When a current flows from the first end of the switch element 1013 to the second end of the switch element 1013, an electrically conductive path is formed between the third end of the switch element 1013 and the fourth end of the switch element 1013. The first current-limiting submodule 1012 may include one or more resistors. The second level is a low level.

The first current-limiting submodule added in the detection circuit can avoid damage to a device in the first detection module caused by an excessive current flowing through the first detection module.

It needs to be noted that FIG. 4 exemplifies the structure of the first detection module 101 by giving an example in which the first current-limiting submodule 1012 is serial-connected between the third end of the switch element 1013 and the first power submodule 1011. In practical applications, another connection relationship between the first current-limiting submodule 1012, the first power submodule 1011, and the switch element 1013 may be: the third end of the switch element 1013 is connected to the first power submodule 1011, and the fourth end of the switch element 1013 is connected to the first end of the first current-limiting submodule 1012, the second end of the first current-limiting submodule 1012 is grounded, the first end of the first current-limiting submodule 1012 serves as the third end A3 of the first detection module 101. The second level is a high level. This embodiment does not limit the connection relationship between the first current-limiting submodule 1012, the first power submodule 1011, and the switch element 1013.

As an example, the detection circuit further also includes a filter module. The third end of the first detection module 101 is connected to the control module 102 by the filter module. For example, the third end of the first detection module 101 is connected to a first end of the filter module, a second end of the filter module is grounded, and a third end of the filter module is connected to the control module.

It needs to be noted that, by being connected to the control module through the filter module, the third end of the first detection module can ensure high stability of a detection signal at the third end of the first detection module.

As an example, the filter module includes a capacitor.

It needs to be noted that, a person skilled in the art understands that the filter module may adopt another circuit structure. For example, a first-order resistor-capacitor (RC) filter circuit structure may be selected. This embodiment does not limit the specific circuit structure of the filter module.

Specifically, using the detection circuit shown in FIG. 2 or FIG. 3 as an example, when the switch module 104 is not closed, if no fault occurs in the drive circuit, an electrically conductive path exists between the drive power module 21 and the first end of the second detection module 102, and the level of the electrical signal at the second end of the first detection module 101 is a preset first level. If a fault occurs in the drive circuit, no electrically conductive path exists between the drive power module 21 and the second detection module 102, and the level of the electrical signal at the second end of the second detection module 102 is not the preset first level. Therefore, when the level of the electrical signal at the second end of the second detection module 102 is not the preset first level, the control module 103 determines that the drive circuit is faulty. After determining that the drive circuit is faulty, the control module 103 closes the switch module 104 to further determine the fault type of the drive circuit. When an open-circuit fault exists in the drive circuit, the current output by the drive power module 21 passes through the first detection module 101. If a shorted-to-ground fault exists in the drive circuit, an impedance of the drive power module 21 to the ground is close to 0, and therefore, the current output by the drive power module 21 will not pass through the first detection module 101. Therefore, the electrical signal at the third end of the first detection module 101 differs depending on the type of fault occurring in the drive circuit.

As can be seen from above, the electrical signal at the second end of the second detection module 102 differs depending on whether a fault occurs in the drive circuit or not. Based on the electrical signal at the second end of the second detection module 102, the control module can determine whether a fault occurs in the drive circuit. When an open-circuit fault or a shorted-to-ground fault occurs in the drive circuit, the electrical signal at the third end of the first detection module 101 differs. The control module 103 can determine the fault type of the drive circuit based on the electrical signal at the third end of the first detection module 101.

It needs to be noted that, a person skilled in the art understands that the first level may be a high level or a low level. In practical applications, the level may be determined based on the device type and circuit structure selected for each module in the detection circuit. For example, when the drive circuit is normal, the level of the electrical signal at the second end of the second detection module 102 is a low-level signal, and the first level is a low level; and, when the drive circuit is faulty, the level of the electrical signal at the second end of the second detection module 102 is a high-level signal, and the first level is a high level.

As an example, the switch element is any one of a photocoupler, a relay, a reed switch, or an optical field effect transistor.

As an example, the detection circuit further includes a first current-limiting module. The first end of the first detection module is connected to the first end of the electrical control device by the first current-limiting module.

It needs to be noted that the first current-limiting module added in the first detection module can avoid problems such as damage to the control module caused by excessive strength of the electrical signal output by the fourth end of the switch element.

Figure 5:
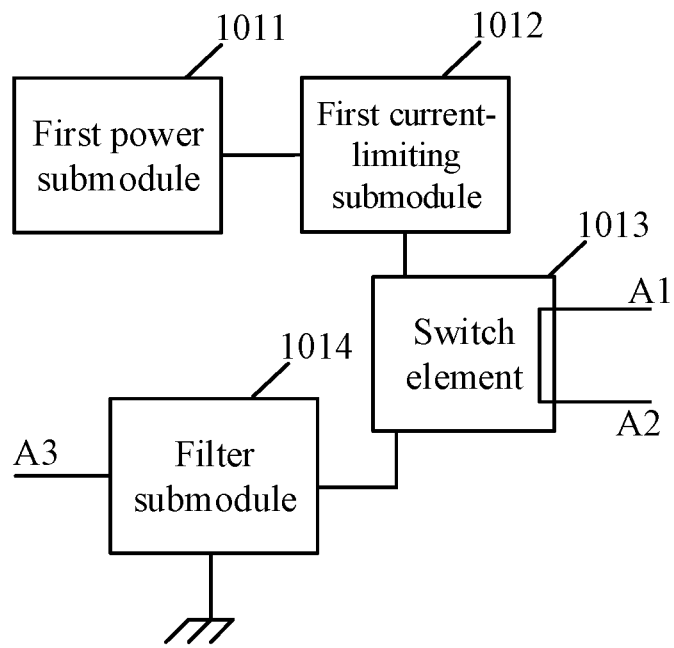
FIG. 5 is another schematic structural diagram of a first detection module according to a second embodiment of this application.

It needs to be noted that, a person skilled in the art understands that in practical applications, the first detection module 101 may adopt another form of structure. For example, as shown in FIG. 5, the first detection module 101 includes: a first power submodule 1011, a filter submodule 1014, a first current-limiting submodule 1012, and a switch element 1013. A first end of the switch element 1013 serves as the first end A1 of the first detection module 101. A second end of the switch element 1013 serves as the second end A2 of the first detection module 101. A third end of the switch element 1013 is connected to the first power submodule 1011 by the first current-limiting submodule 1012. A fourth end of the switch element 1013 is connected to a first end of the filter submodule 1014. A second end of the filter submodule 1014 is grounded. A third end of the filter submodule 1014 serves as the third end A3 of the first detection module. The second level is a high level. The filter submodule 1014 may be a capacitor. A first end of the capacitor serves as the first end and the third end of the filter submodule, and a second end of the capacitor serves as the second end of the filter submodule. The filter submodule 1014 may adopt an RC filter structure or the like.

In contrast with existing technologies, in the detection circuit of an electrical control device according to this embodiment, because connection status between the third end of the switch element and the fourth end of the switch element differs between an occasion of an open-circuit fault and a shorted-to-ground fault of the drive circuit, the electrical signal at the third end of the first detection module differs. Therefore, the control module can determine the fault type based on the electrical signal at the third end of the first detection module.

A third embodiment of this application relates to a detection circuit of an electrical control device. This embodiment exemplifies the circuit structure of the second detection module 102 mentioned in the first embodiment. The content that has been described in the first embodiment is omitted here.

Figure 6:
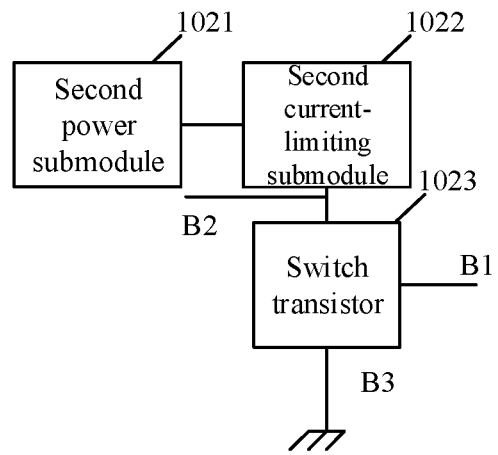
FIG. 6 is a schematic structural diagram of a second detection module according to a third embodiment of this application.

Specifically, as shown in FIG. 6, in this embodiment, the second detection module 102 includes a second power submodule 1021, a second current-limiting submodule 1022, and a switch transistor 1023. The second power submodule 1021 is connected to a first end of the switch transistor 1023 by the second current-limiting submodule 1022. A control end of the switch transistor 1023 serves as a first end B1 of the second detection module. The first end of the switch transistor 1023 serves as a second end B2 of the second detection module. A second end of the switch transistor 1023 serves as a third end B3 of the second detection module.

Specifically, because status of the switch transistor 1023 changes depending on a voltage value of an electrical signal input into the control end of the switch transistor 1023, when electrical conduction is actuated between the first end and the second end of the switch transistor 1023, the first end of the switch transistor 1023 exhibits a low-level signal. When electrical conduction is not actuated between the first end and the second end of the switch transistor 1023, the first end of the switch transistor 1023 exhibits a high-level signal. Because the electrical signal received at the control end of the switch transistor 1023 differs between an occasion when the drive circuit of the electrical control device 20 is normal and an occasion when the drive circuit of the electrical control device 20 is faulty, the electrical signal at the first end of the switch transistor 1023 differs.

It is assumed that the switch transistor is an N-type transistor and the preset first level is a low level. If the first end of the switch transistor exhibits a low-level signal, it means that the switch transistor is closed, that is, the drive circuit of the electrical control device is normal. If the first end of the switch transistor exhibits a high-level signal, it means that the switch transistor is not closed, that is, the drive circuit of the electrical control device is faulty, and the fault type needs to be further determined based on a detection result of the first detection module.

As an example, the detection circuit further includes a second current-limiting module. The second end B2 of the second detection module 102 is connected to the control module 103 by the second current-limiting module.

It needs to be noted that the second current-limiting module added in the detection circuit can avoid problems such as damage to the control module caused by excessive strength of the first electrical signal.

Figure 7:
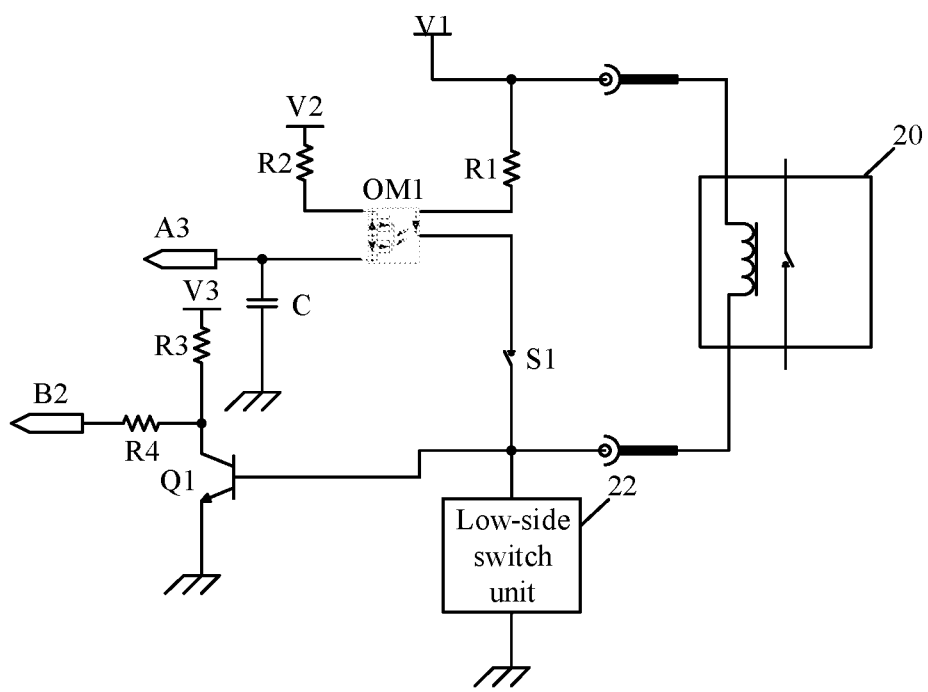
FIG. 7 is a circuit diagram of a drive circuit and a detection circuit of an electrical control device according to a third embodiment of this application.

As an example, the electrical control device 20 is a relay. The drive circuit of the relay includes a drive power module V1 and a low-side switch unit 22. The first detection module adopts a structure shown in FIG. 5, and the second detection module adopts a structure enumerated in the third embodiment. FIG. 7 shows circuit diagrams of the drive circuit and the detection circuit of the electrical control device. In FIG. 7, V1 represents a drive power module of the drive circuit, S1 represents a switch module, R1 represents a first current-limiting module, V2 represents a first power submodule, R2 represents a first current-limiting submodule, represents a switch element, C represents a filter submodule, A3 represents a third end of the first detection module, V3 represents a second power submodule, R3 represents a second current-limiting submodule, B2 represents a second end of the second detection module, R4 represents a second current-limiting module, and Q1 represents a switch transistor. The first level is a low level, and the second level is a high level.

It needs to be noted that FIG. 7 exemplifies a detection circuit in which a switch module is disposed. In practical applications, S1 may be absent, that is, the second end of OW is directly connected to the first end of the low-side switch unit 22.

In contrast with existing technologies, in the detection circuit of an electrical control device provided in this embodiment, because the electrical signal at the control end of the switch transistor differs between an occasion of no fault occurring in the drive circuit and an occasion of a fault occurring in the drive circuit, the status of the switch transistor differs. Consequently, the electrical signal at the first end of the switch transistor differs. Therefore, the control module can determine, based on the electrical signal at the first end of the switch transistor, whether a fault occurs in the drive circuit.

A fourth embodiment of this application relates to a detection circuit of an electrical control device. This embodiment is a further improvement of the first embodiment. The specific improvement is: a freewheeling module 105 is added in the detection circuit. The content that has been described in the first embodiment is omitted here.

Figure 8:
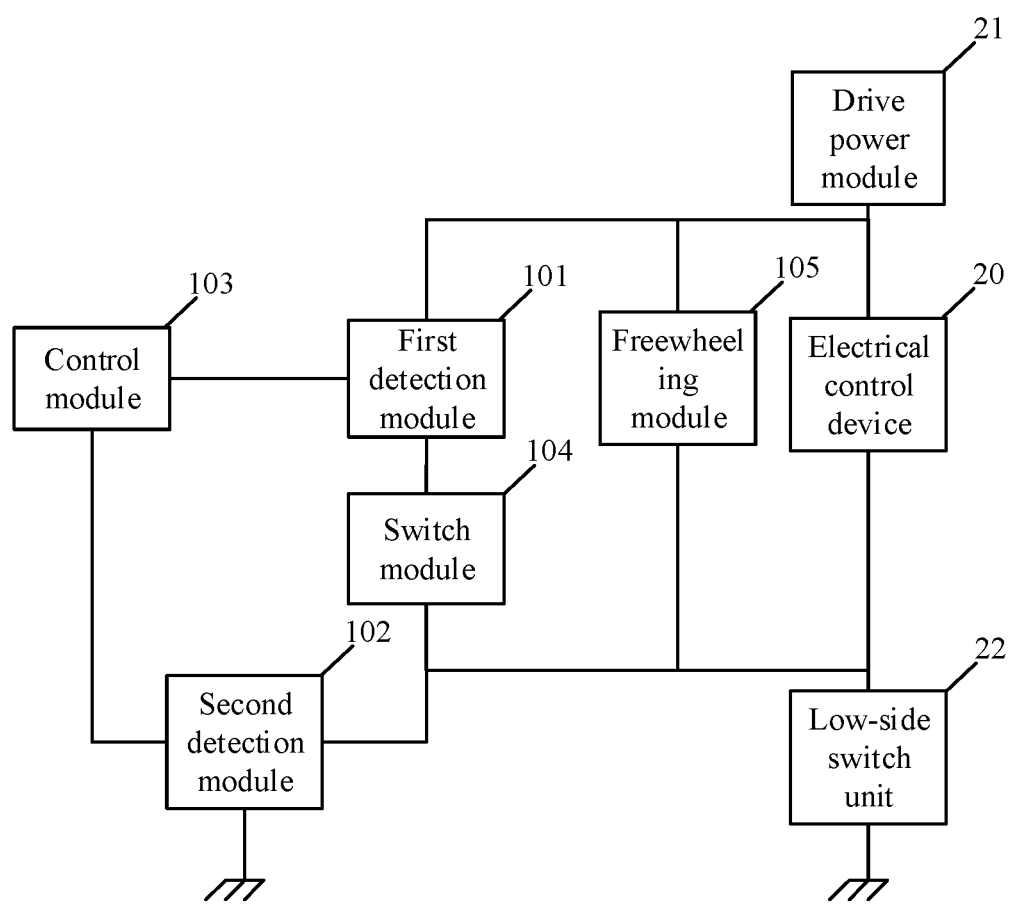
FIG. 8 is a schematic structural diagram of a detection circuit of an electrical control device according to a fourth embodiment of this application.

Specifically, as shown in FIG. 8, the freewheeling module 105 is parallel-connected to the electrical control device 20.

Figure 9:
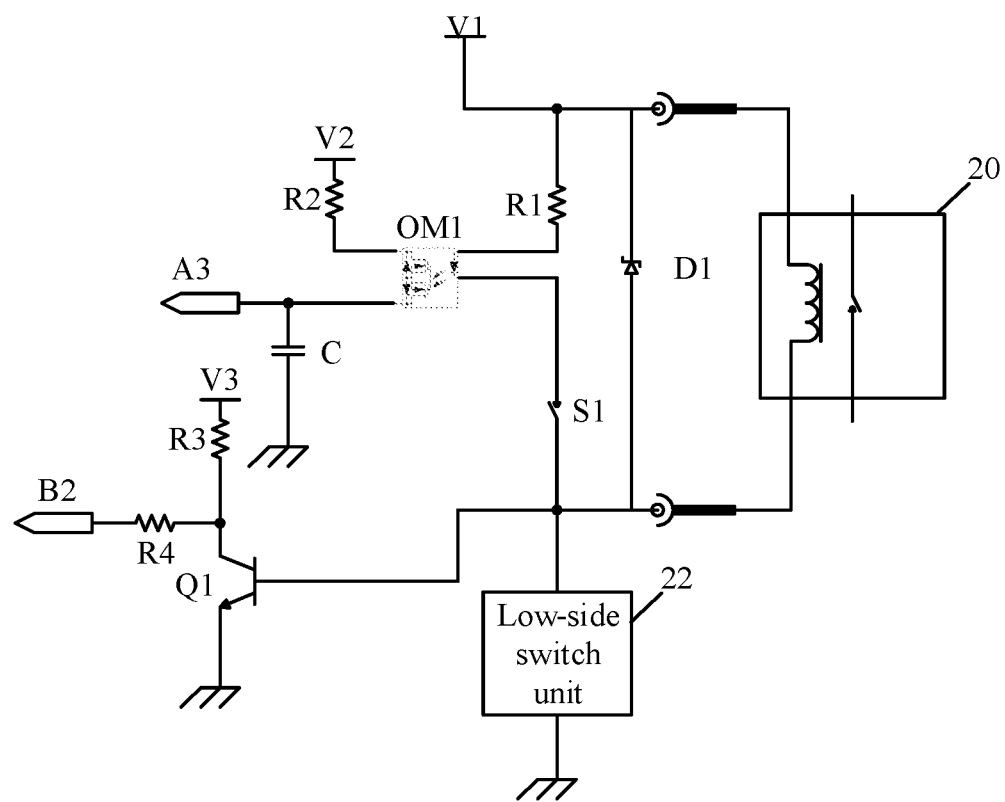
FIG. 9 is a circuit diagram of a drive circuit and a detection circuit of an electrical control device according to a fourth embodiment of this application.

As an example, the freewheeling module 105 is a transient voltage suppression diode, and the circuit diagrams of the drive circuit and the detection circuit of the electrical control device are shown in FIG. 9. In FIG. 9, D1 represents a transient voltage suppression diode, V1 represents a drive power of the drive circuit, S1 represents a switch module, R1 represents a first current-limiting module, V2 represents a first power submodule, R2 represents a first current-limiting submodule, OW represents a switch element, C represents a filter submodule, A3 represents a third end of the first detection module, V3 represents a second power submodule, R3 represents a second current-limiting submodule, B2 represents a second end of the second detection module, R4 represents a second current-limiting module, and Q1 represents a switch transistor.

Figure 10:
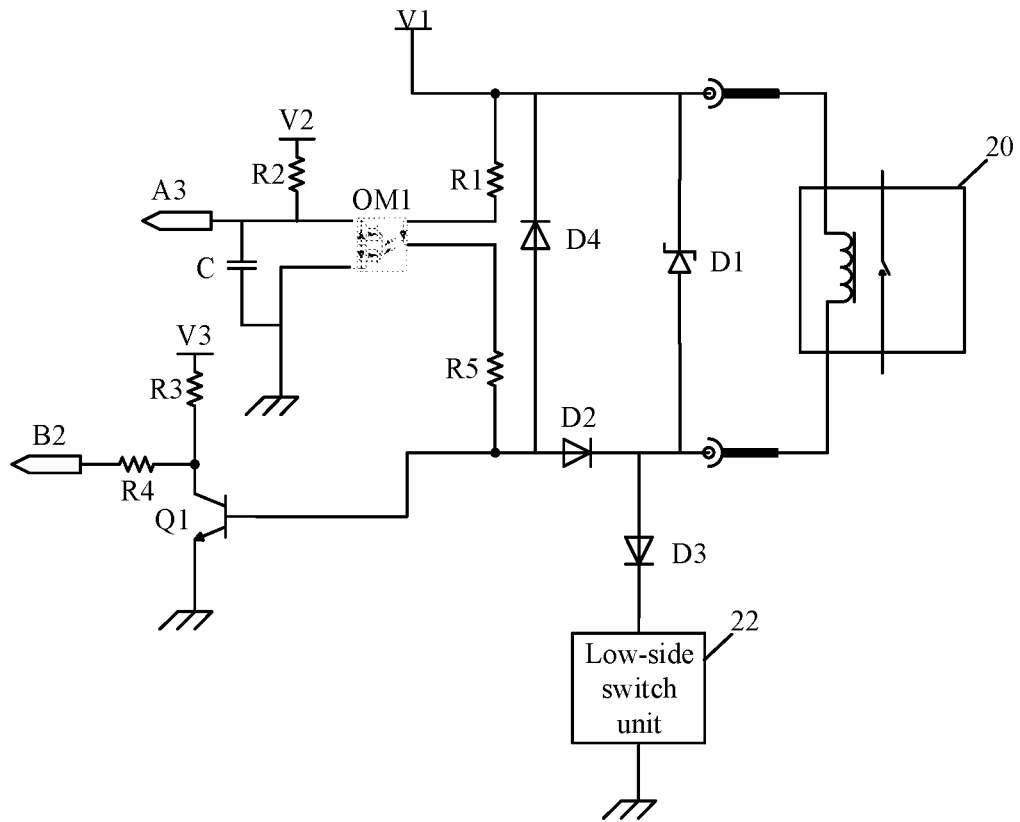
FIG. 10 is a circuit diagram of a drive circuit and another detection circuit of an electrical control device according to a fourth embodiment of this application.

As an example, the detection circuit further includes a third current-limiting module, a first Zener diode, a first anti-reverse diode, and a second anti-reverse diode. The second end of the first detection module is connected to a first end of the first anti-reverse diode by the third current-limiting module. A second end of the first anti-reverse diode is connected to the second end of the electrical control device. The first end of the low-side switch unit is connected to the second end of the electrical control device by the second anti-reverse diode. A first end of the first Zener diode is connected to the second end of the electrical control device. A second end of the first Zener diode is connected to the first end of the electrical control device. For example, FIG. 10 is a circuit diagram of a drive circuit and a detection circuit, where D1 represents a transient voltage suppression diode, V1 represents a drive power of the drive circuit, R1 represents a first current-limiting module, V2 represents a first power submodule, R2 represents a first current-limiting submodule, OW represents a switch element, C represents a filter submodule, A3 represents a third end of the first detection module, V3 represents a second power submodule, R3 represents a second current-limiting submodule, B2 represents a second end of the second detection module, R4 represents a second current-limiting module, Q1 represents a switch transistor, R5 represents a third current-limiting module, D2 represents a first anti-reverse diode, D3 represents a second anti-reverse diode, and D4 represents a first Zener diode.

It needs to be noted that a person skilled in the art understands that, as an example in this embodiment, the third current-limiting module, the first Zener diode, the first anti-reverse diode, and the second anti-reverse diode are disposed concurrently. In practical applications, any one or more of the third current-limiting module, the first Zener diode, the first anti-reverse diode, and the second anti-reverse diode may be disposed selectively.

In contrast with existing technologies, in the detection circuit of an electrical control device provided in this embodiment, the freewheeling module is parallel-connected to the electrical control device. When the current flowing in the electrical control device disappears, an induced electromotive force generated by the electrical control device is consumed by work done in a loop formed by the freewheeling module and the electrical control device, thereby protecting safety of other devices in the circuit.

A fifth embodiment of this application relates to a detection circuit of an electrical control device. This embodiment exemplifies the structure of the control module mentioned in the first embodiment.

Figure 11:
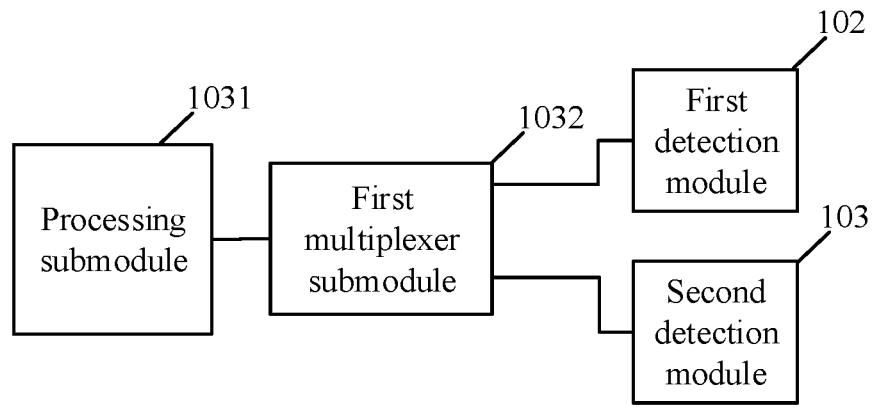
FIG. 11 is a schematic structural diagram of a control module according to a fifth embodiment of this application.

Specifically, as shown in FIG. 11, the control module 103 includes a processing submodule 1031 and a first multiplexing submodule 1032. The processing submodule 1031 is connected to the third end of the first detection module 101 and the second end of the second detection module 102 by the first multiplexing submodule 1032.

Figure 12:
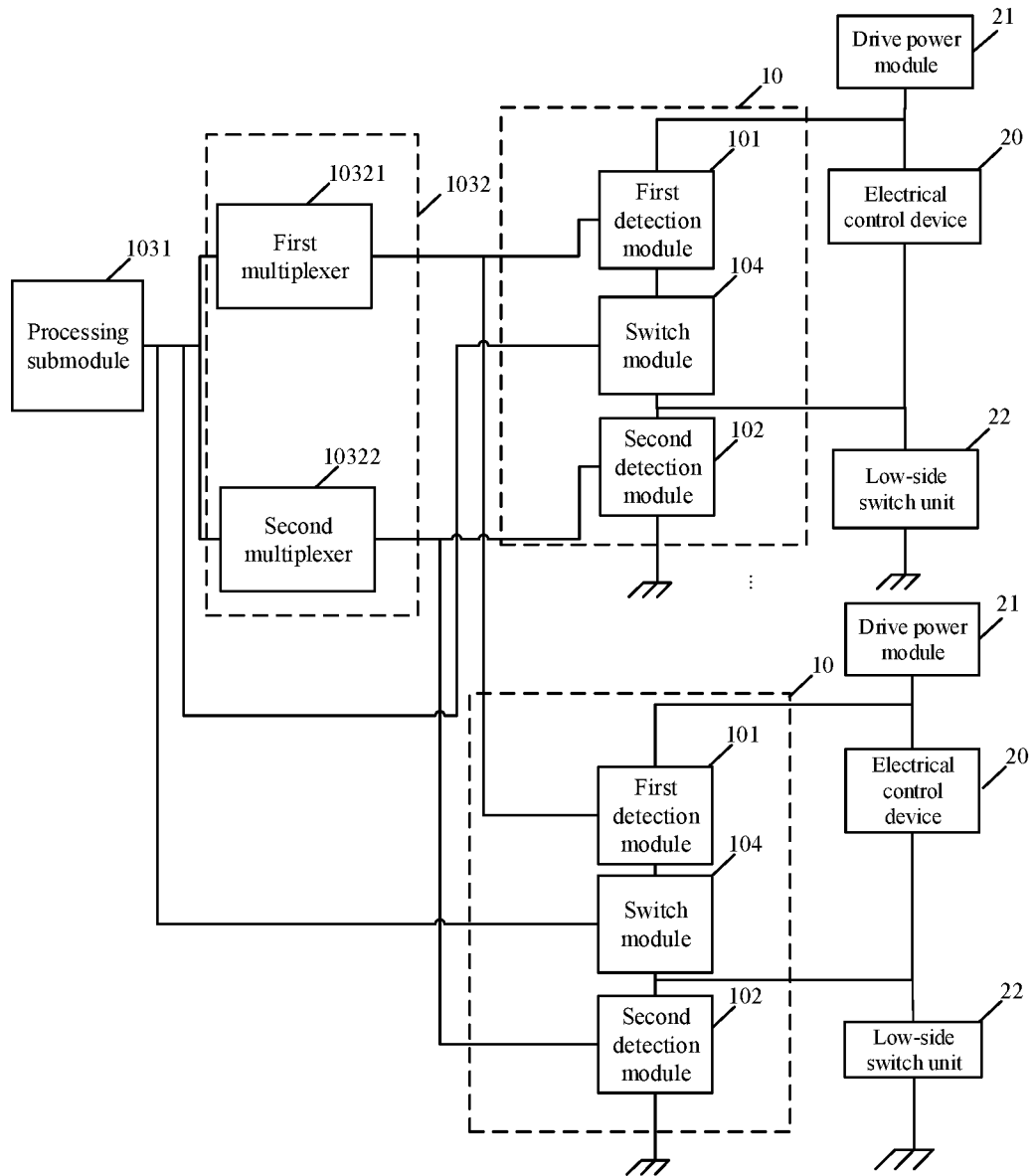
FIG. 12 is a circuit diagram of a drive circuit and a detection circuit of an electrical control device according to a fifth embodiment of this application.

As an example, as shown in FIG. 12, the first multiplexing submodule 1032 includes a plurality of multiplexers. For example, the first multiplexing submodule 1032 includes a first multiplexer 10321 and a second multiplexer 10322. The processing submodule 1031 is connected to the third end of the first detection module 101 by the first multiplexer 10321. The processing submodule 1031 is connected to the second end of the second detection module 102 by the second multiplexer 10322.

It needs to be noted that the processing submodule 1031 is connected to the first detection module 101 and the second detection module 102 by the multiplexing submodule to implement a "one-to-many" detection function of a processor port, thereby reducing the required quantity of ports of the processing submodule. In this way, one processing submodule can be connected to more first detection modules 101 and second detection modules 102.

A sixth embodiment of this application relates to a detection circuit of an electrical control device. This embodiment exemplifies the structure of the control module mentioned in the first embodiment.

Figure 13:
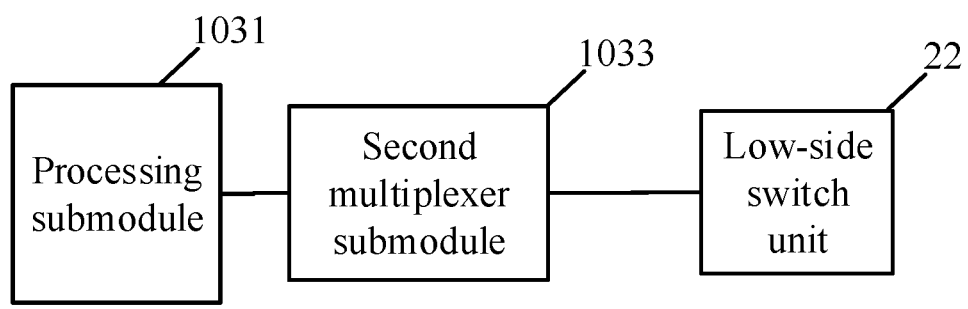
FIG. 13 is a schematic structural diagram of a control module according to a sixth embodiment of this application.

Specifically, as shown in FIG. 13, the control module 103 includes a processing submodule 1031 and a second multiplexing submodule 1033. The processing submodule 1031 is connected to the low-side switch unit 22 by the second multiplexing submodule 1033.

It needs to be noted that the processing submodule is connected to the high-side switch unit and the low-side switch unit in a "one-to-many" connection mode, thereby further reducing the required quantity of ports of the processing submodule.

Figure 14:
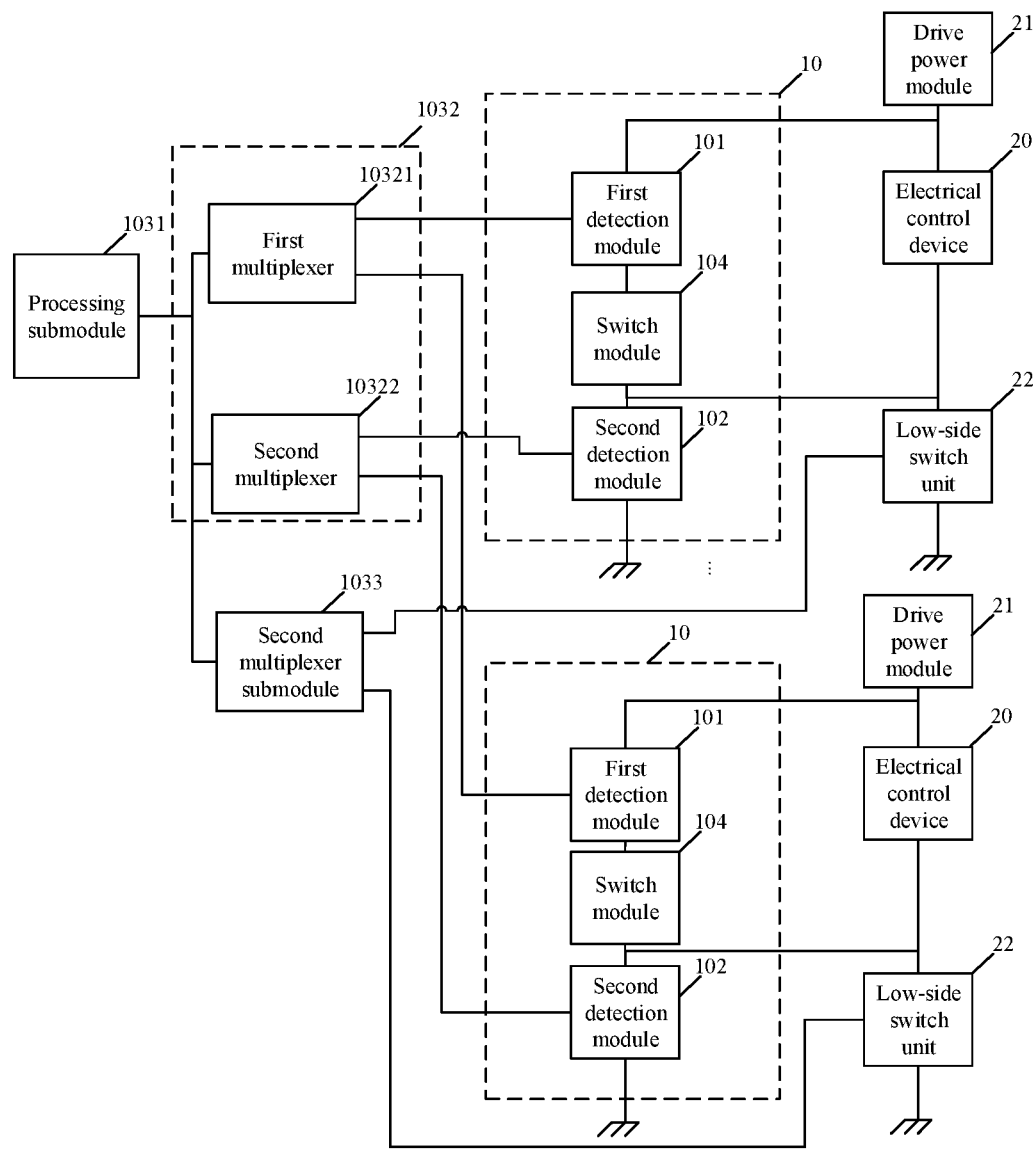
FIG. 14 is a schematic structural diagram of a detection circuit and a drive circuit of the electrical control device according to a sixth embodiment of this application.

As an example, as shown in FIG. 14, the control module 103 includes a processing submodule 1031, a first multiplexing submodule 1032, and a second multiplexing submodule 1033 to implement a one-to-many detection function and a one-to-many control function.

Figure 15:
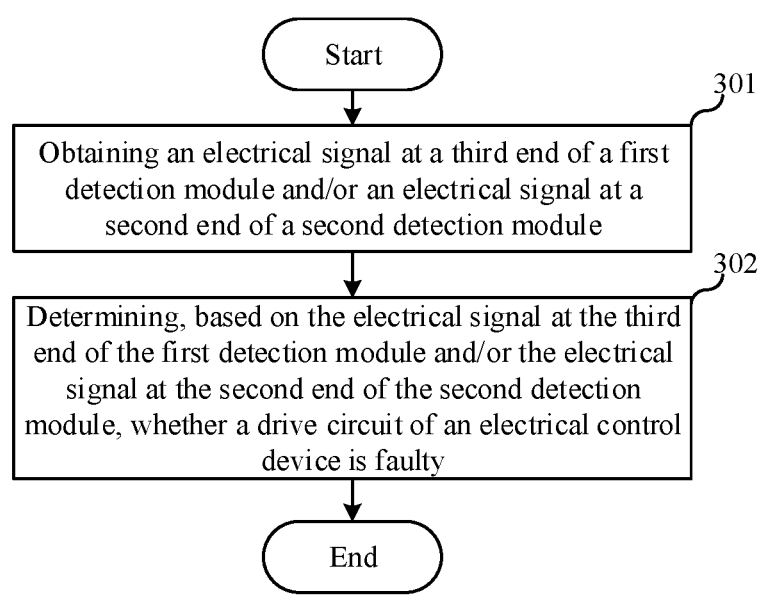
FIG. 15 is a flowchart of a detection method of an electrical control device according to a seventh embodiment of this application.

A seventh embodiment of this application relates to a detection method of an electrical control device, applied to the control module in the detection circuit of an electrical control device according to any of the first to sixth embodiments. As shown in FIG. 15, the detection method of an electrical control device includes the following steps:

Step 301: Obtaining an electrical signal at a third end of a first detection module and/or an electrical signal at a second end of a second detection module; and Step 302: Determining, based on the electrical signal at the third end of the first detection module and/or the electrical signal at the second end of the second detection module, whether a drive circuit of the electrical control device is faulty.

In this embodiment of this application, the detection method may specifically include:

obtaining an electrical signal at a third end of a first detection module, and determining, based on the electrical signal at the third end of the first detection module, whether a drive circuit of the electrical control device is faulty; or obtaining an electrical signal at a second end of a second detection module, and determining, based on the electrical signal at the second end of the second detection module, whether a drive circuit of the electrical control device is faulty; or obtaining an electrical signal at a third end of a first detection module and an electrical signal at a second end of a second detection module, and determining, based on the electrical signal at the third end of the first detection module and the electrical signal at the second end of the second detection module, whether a drive circuit of the electrical control device is faulty.

Specifically, the electrically conductive state of a normal-state drive circuit of the electrical control device is different from the electrically conductive state of a faulty-state drive circuit of the electrical control device. A different voltage at the first end of the electrical control device in the drive circuit and/or a different voltage at the second end of the electrical control device lead to a different conductive state of an internal circuit in the first detection module and the second detection module. Therefore, the third end of the first detection module and/or the second end of the second detection module may be detected to determine whether the drive circuit is faulty. In this way, the fault of the drive circuit of the electrical control device can be detected.

Evidently, this embodiment is a method embodiment corresponding to the first to sixth embodiments, and this embodiment may be implemented in coordination with the first to sixth embodiments. Relevant technical details mentioned in the first to sixth embodiments are still applicable to this embodiment. For brevity, the details are omitted here. Correspondingly, the relevant technical details mentioned in this embodiment are applicable in the first to sixth embodiments.

An eighth embodiment of this application relates to a detection method of an electrical control device. This embodiment exemplifies a process mentioned in the seventh embodiment, that is, a process by which the control module determines, based on the electrical signal at the third end of the first detection module and the electrical signal at a second end of a second detection module, whether a fault occurs in the drive circuit of the electrical control device.

Figure 16:
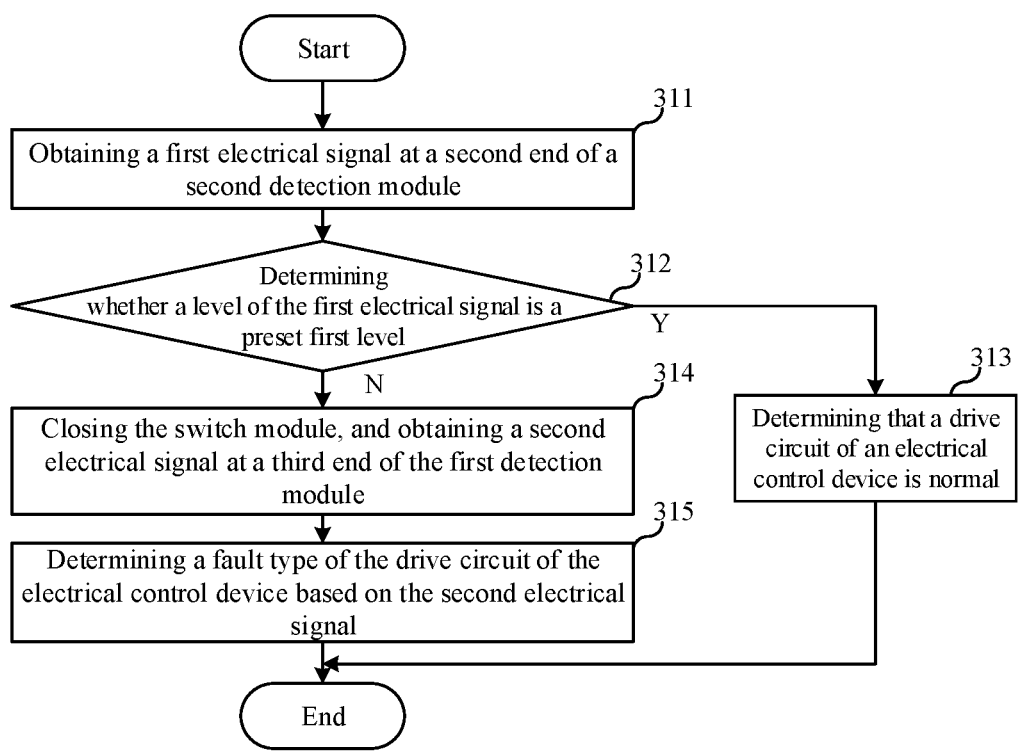
FIG. 16 is a flowchart of a detection method of an electrical control device according to an eighth embodiment of this application.

Specifically, as shown in FIG. 16, when a low-side switch unit in a drive circuit of the electrical control device is not enabled, the control module performs the following steps.

Step 311: Obtaining a first electrical signal at a second end of a second detection module.

Specifically, the control module may determine, based on the first electrical signal, whether the drive circuit of the electrical control device is normal.

Step 312: Determining whether a level of the first electrical signal is a preset first level.

Specifically, if a determining result is that the level of the first electrical signal is the preset first level, the process goes to step 313; or, if the level of the first electrical signal is not the preset first level, the process goes to step 315.

As an example, the second detection module includes a second power submodule, a second current-limiting submodule, and a switch transistor. The second power submodule is connected to a first end of the switch transistor by the second current-limiting submodule. A second end of the switch transistor serves as a third end of the second detection module. A control end of the switch transistor serves as a first end of the second detection module. The first end of the switch transistor serves as the second end of the second detection module. If the switch transistor is an N-type transistor, the first level is a low level; or, if the switch transistor is a P-type transistor, the first level is a high level. If the level of the first electrical signal is the first level, it proves that the switch transistor is enabled, and therefore, it proves that the drive circuit of the electrical control device is normal. If the level of the first electrical signal is not the first level, it proves that the switch transistor is not enabled, and therefore, the drive circuit is abnormal.

Step 313: Determining that a drive circuit of the electrical control device is normal. Then the process ends.

Step 314: Closing the switch module, and obtaining a second electrical signal at a third end of the first detection module.

Step 315: Determining a fault type of the drive circuit of the electrical control device based on the second electrical signal.

Specifically, when an open-circuit fault exists in the drive circuit, a current output by the drive power module passes through the first detection module. If a shorted-to-ground fault exists in the drive circuit, an impedance of the drive power module to the ground is close to 0, and therefore, the current output by the drive power module will not pass through the first detection module. Therefore, the electrical signal at the third end of the first detection module differs depending on the type of fault occurring in the drive circuit. The control module can determine the fault type of the drive circuit of the electrical control device based on the electrical signal at the third end of the first detection module.

Evidently, this embodiment is a method embodiment corresponding to the first to sixth embodiments, and this embodiment may be implemented in coordination with the first to sixth embodiments. Relevant technical details mentioned in the first to sixth embodiments are still applicable to this embodiment. For brevity, the details are omitted here. Correspondingly, the relevant technical details mentioned in this embodiment are applicable in the first to sixth embodiments.

A ninth embodiment of this application relates to a detection method of an electrical control device. This embodiment is a further improvement of the eighth embodiment. The specific improvement is: before step 311, other relevant steps are added, and step 316 is itemized.

Figure 17:
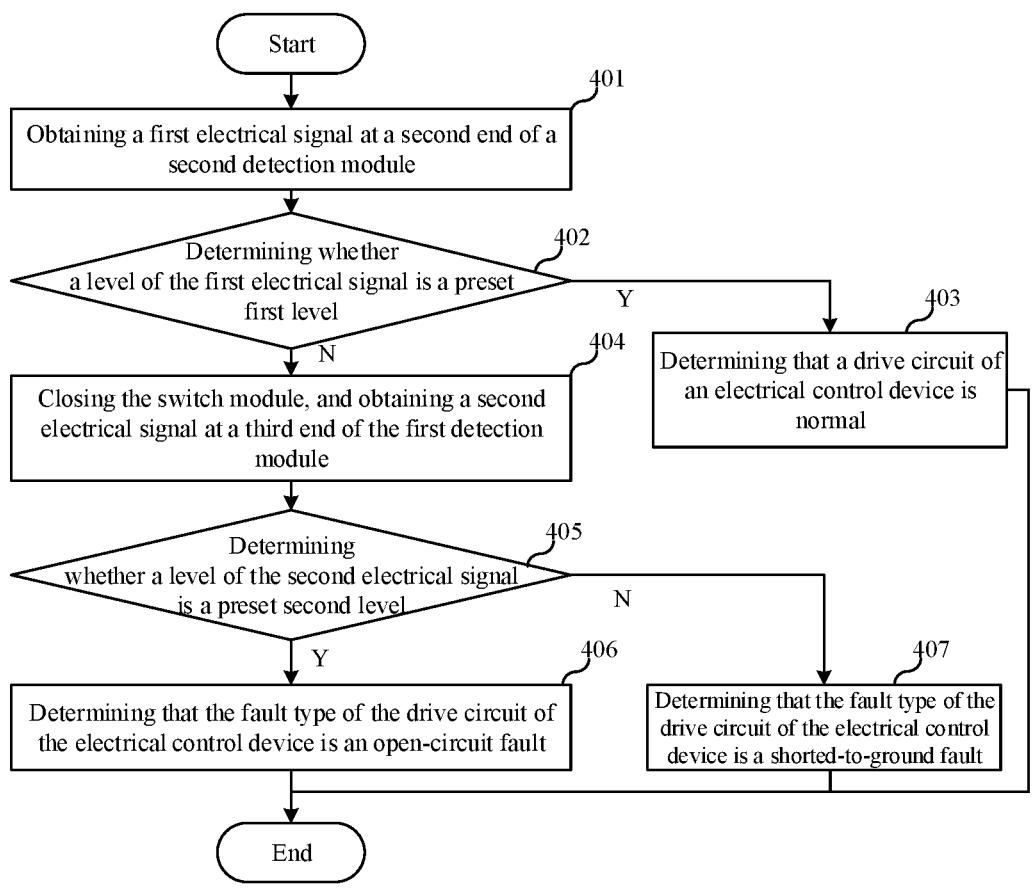
FIG. 17 is a flowchart of a detection method of an electrical control device according to a ninth embodiment of this application.

Specifically, as shown in FIG. 17, the detection method of an electrical control device includes steps 401 to 407. Steps 401 to 405 are substantially the same as steps 311 to 314 of the eighth embodiment, and are omitted here. The differences are described below.

Step 401: Obtaining a first electrical signal at a second end of a second detection module.

Step 402: Determining whether a level of the first electrical signal is a preset first level.

Specifically, if a determining result is that the level of the first electrical signal is the preset first level, the process goes to step 403; or, if the level of the first electrical signal is not the preset first level, the process goes to step 404.

Step 403: Determining that a drive circuit of the electrical control device is normal. Then the process ends.

Step 404: Closing the switch module, and obtaining a second electrical signal at a third end of the first detection module.

Step 405: Determining whether a level of the second electrical signal is a preset second level.

Specifically, if a determining result is that the level of the second electrical signal is the preset second level, the process goes to step 406; or, if the level of the second electrical signal is not the preset second level, the process goes to step 407.

As an example, the first detection module includes a first power submodule, a filter submodule, a first current-limiting submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module. When a current flows from the first end of the switch element to the second end of the switch element, an electrically conductive path is formed between the third end of the switch element and the fourth end of the switch element. When an open-circuit fault occurs in the drive circuit, the current output from the drive power module flows through the first end of the switch element to the second end of the switch element, and an electrically conductive path is formed between the third end of the switch element and the fourth end of the switch element. Therefore, the electrical signal at the fourth end of the switch element is the second electrical signal. When a shorted-to-ground fault occurs in the drive circuit, an output end of the drive power module achieves an equivalent effect of being connected to the ground, and no current flows between the first end of the switch element and the second end of the switch element, and no electrically conductive path can be formed between the third end of the switch element and the fourth end of the switch element. Therefore, the electrical signal at the fourth end of the switch element is not the second electrical signal.

Step 406: Determining that the fault type of the drive circuit of the electrical control device is an open-circuit fault. Then the process ends.

Step 407: Determining that the fault type of the drive circuit of the electrical control device is a shorted-to-ground fault.

It needs to be noted that a person skilled in the art understands that in practical applications, the purpose of determining the fault type can also be fulfilled by replacing steps 404 to 407 with other steps, and this embodiment does not limit the process of determining the fault type.

For example, steps 404 to 407 may be replaced with the following steps.

Step 404': Closing the switch module, and obtaining a second electrical signal at the third end of the first detection module and a third electrical signal at the second end of the second detection module;

Step 405': Determining whether both the second electrical signal and the third electrical signal satisfy the corresponding preset conditions.

Specifically, the preset condition corresponding to the second electrical signal is: the level of the second electrical signal is not the preset second level. The preset condition corresponding to the third electrical signal is: the level of the third electrical signal is not the first level. If it is determined that the level of the second electrical signal is the preset second level and the level of the third electrical signal is the first level, the process goes to step 406'; or, if it is determined that the level of the second electrical signal is not the preset second level or the level of the third electrical signal is not the first level, the process goes to step 407'.

Step 406': Determining that the fault type of the drive circuit of the electrical control device is a shorted-to-ground fault.

Step 407': Determining that the fault type of the drive circuit of the electrical control device is an open-circuit fault.

Evidently, this embodiment is a method embodiment corresponding to the first to sixth embodiments, and this embodiment may be implemented in coordination with the first to sixth embodiments. Relevant technical details mentioned in the first to sixth embodiments are still applicable to this embodiment. For brevity, the details are omitted here. Correspondingly, the relevant technical details mentioned in this embodiment are applicable in the first to sixth embodiments.

A tenth embodiment of this application relates to a detection method of an electrical control device. This embodiment is a further improvement of the ninth embodiment. The specific improvement is: in this embodiment, when the level of the first electrical signal is a first level, a process of detecting a low-side switch unit and a high-side switch unit is added.

Figure 18:
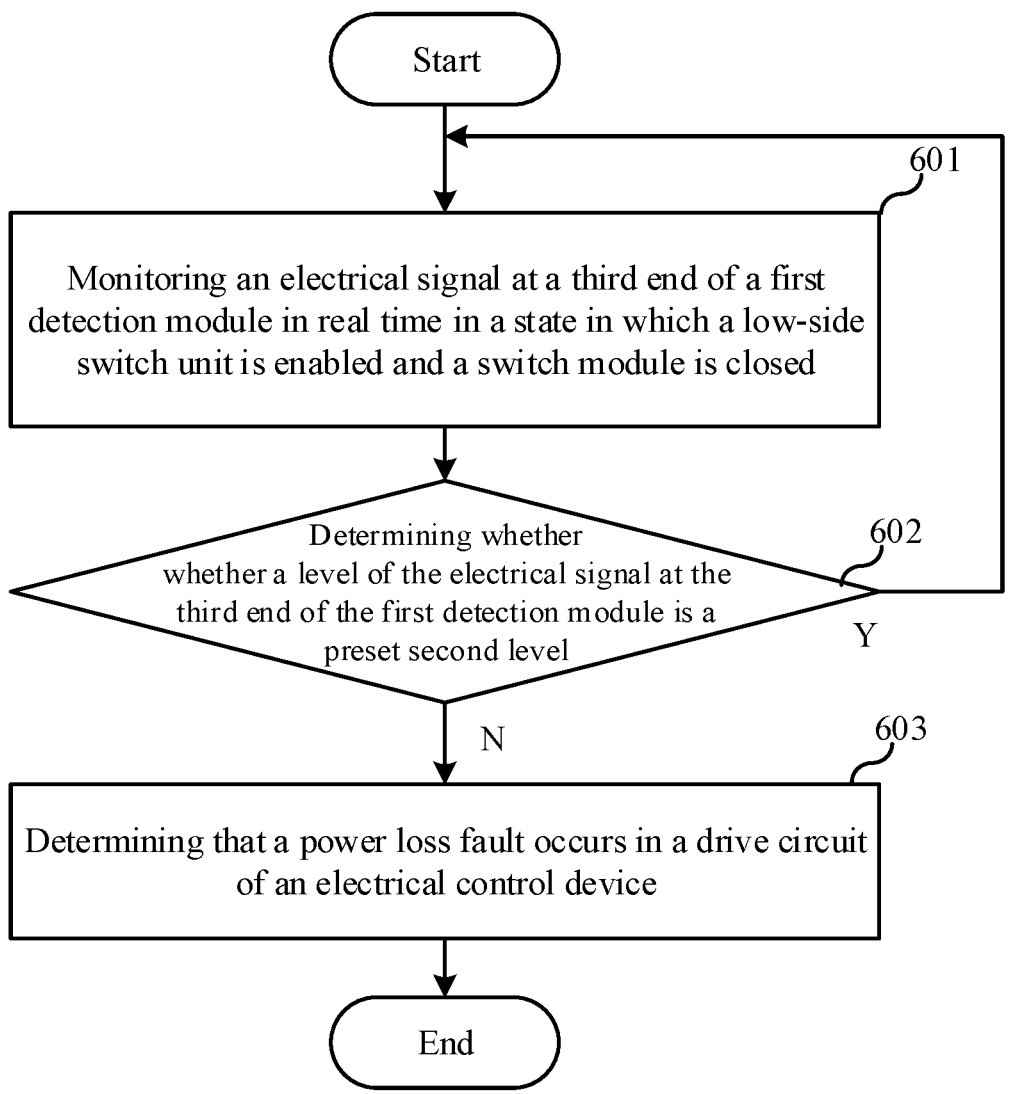
FIG. 18 is a flowchart of a detection method of an electrical control device according to a tenth embodiment of this application.

As an example, after detection of various faults in the drive circuit of the electrical control device is completed, the drive circuit of the electrical control device is further monitored, so that the drive circuit of the electrical control device can be monitored when the electrical control device is enabled. As shown in FIG. 18, a method for monitoring the electrical control device includes the following steps.

Step 601: Monitoring an electrical signal at a third end of a first detection module in real time in a state in which a low-side switch unit is enabled and a switch module is closed.

Step 602: Determining whether a level of the electrical signal at the third end of the first detection module is a preset second level.

Specifically, if a determining result is that the level of the electrical signal is not the preset second level, the process goes to step 603; or, if the level of the electrical signal is the preset second level, the process returns to step 601.

Step 603: Determining that a power loss fault occurs in a drive circuit of the electrical control device.

As an example, the electrical control device is a relay, and the first detection module includes: a first power submodule, a filter submodule, a first current-limiting submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module. When a current flows from the first end of the switch element to the second end of the switch element, an electrically conductive path is formed between the third end of the switch element and the fourth end of the switch element. The switch element is a photocoupler. After the control module closes the switch module, a light-emitting diode in the photocoupler is parallel-connected to a coil of the relay. In this case, if the voltage across the coil of the relay is a normal drive voltage, a light receiving end of the photocoupler will be turned on, and a high-level voltage exists at the third end of the second detection module. When the control module determines that no high-level voltage is detected at the third end of the second detection module, no high-level voltage exists at the third end of the second detection module, and a power loss fault may occur in the drive circuit. The power loss fault means that a connection between a first end of the relay and the drive power module fails. A possible reason for this is that the drive power module is faulty (for example, the power supply is exhausted, or the like), or that the drive power module is shorted to the ground, or that a wire harness at either end of the relay is loose, or that the relay is open-circuited, or the like.

As can be seen from above, by monitoring the electrical signal at the third end of the first detection module, the control module can detect whether the drive circuit of the relay is faulty.

It needs to be noted that by monitoring the electrical signal at the third end of the first detection module, the normal or abnormal state of the drive circuit of the electrical control device is detected, thereby discovering in time the abnormal working state of the electrical control device caused by the fault in the drive circuit of the electrical control device.

It needs to be noted that a person skilled in the art understands that in practical applications, the occurrence of a fault may also be determined by monitoring the electrical signal at the second end of the second detection module, or by monitoring both the electrical signal at the second end of the first detection module and the electrical signal at the third end of the first detection module.

As an example, the control module monitors the electrical signal at the second end of the second detection module. Specifically, the control module monitors the electrical signal at the second end of the second detection module in real time in a state in which a low-side switch unit is enabled and the switch module is turned off; and determines, if it is determined that a level of the electrical signal at the second end of the second detection module is a preset first level, that an open-circuit fault occurs in the low-side switch unit.

Figure 19:
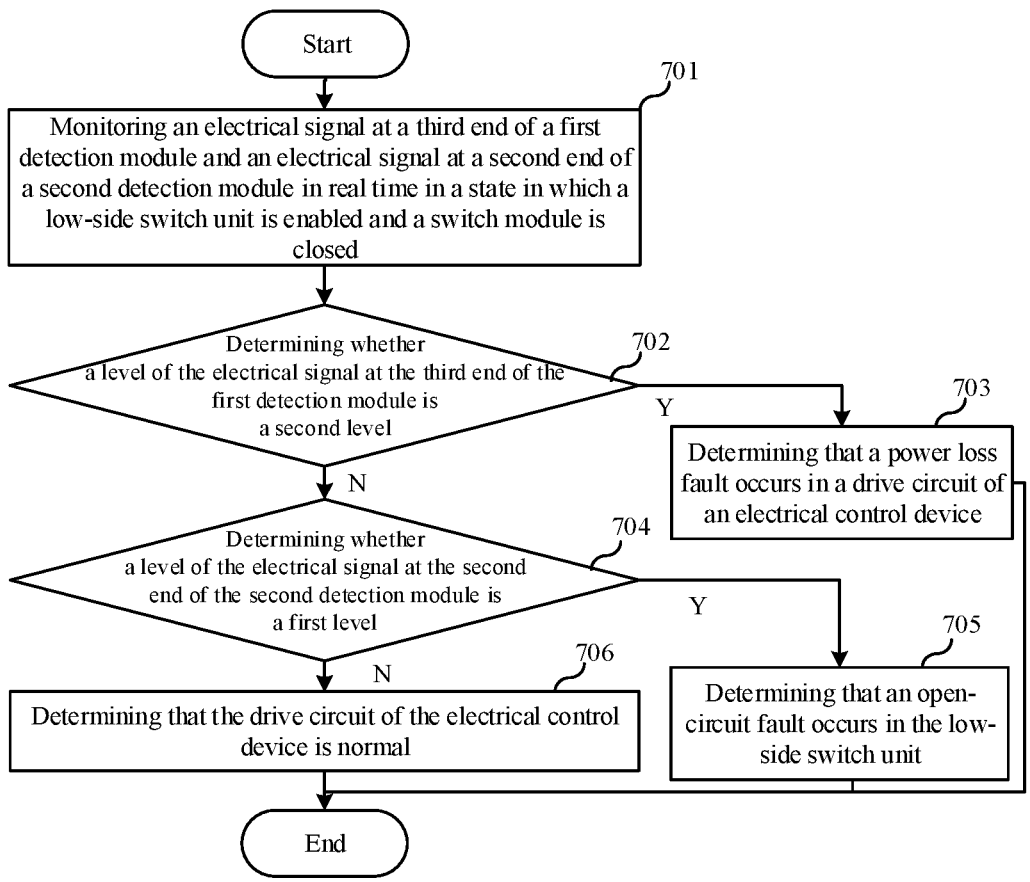
FIG. 19 is a flowchart of a monitoring method of an electrical control device according to a tenth embodiment of this application.

As an example, the control module monitors both the electrical signal at the second end of the first detection module and the electrical signal at the third end of the first detection module. Specifically, as shown in FIG. 19, the detection method includes the following steps.

Step 701: Monitoring an electrical signal at a third end of a first detection module and an electrical signal at a second end of a second detection module in real time in a state in which a low-side switch unit is enabled and a switch module is closed.

Step 702: Determining whether a level of the electrical signal at the third end of the first detection module is a preset second level.

Specifically, if a determining result is that the level of the first electrical signal is the preset first level, the process goes to step 703; or, if the level of the first electrical signal is not the preset first level, the process goes to step 704.

Step 703: Determining that a power loss fault occurs in a drive circuit of the electrical control device. Then the process ends.

Step 704: Determining whether a level of the electrical signal at the second end of the second detection module is a preset first level.

Specifically, if a determining result is that the level of the first electrical signal is the preset first level, the process goes to step 705; or, if the level of the first electrical signal is not the preset first level, the process goes to step 706.

Step 705: Determining that an open-circuit fault occurs in the low-side switch unit.

Step 706: Determining that the drive circuit of the electrical control device is normal.

In contrast with existing technologies, in the detection circuit of an electrical control device provided in this embodiment, the control module can monitor the drive circuit of the electrical control device when the electrical control device is enabled, thereby improving safety performance of a system that uses the electrical control device.

Evidently, this embodiment is a method embodiment corresponding to the sixth embodiment, and this embodiment may be implemented in coordination with the sixth embodiment. Relevant technical details mentioned in the sixth embodiment are still applicable to this embodiment. For brevity, the details are omitted here. Correspondingly, the relevant technical details mentioned in this embodiment are applicable in the sixth embodiment.

Figure 20:
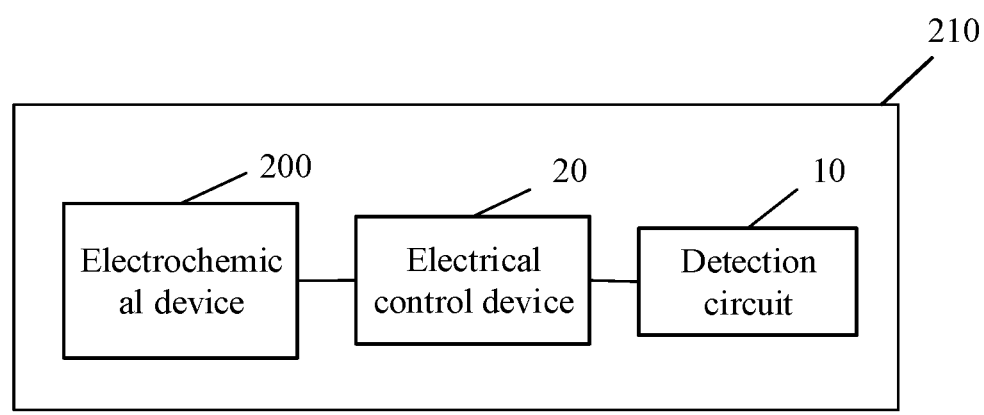
FIG. 20 is a schematic structural diagram of an electric vehicle according to an embodiment of this application.

An embodiment of this application further provides an electric vehicle. As shown in FIG. 20, the electric vehicle 210 includes an electrochemical device 200, an electrical control device 20, and any detection circuit 10 described in the foregoing embodiments. The electrochemical device may be a battery pack that provides electrical power for the electric vehicle. The electrical control device may be a relay or another device that uses a low current to control its status. The detection circuit is configured to detect a drive circuit of the electrical control device. The drive circuit of the electrical control device may include a drive power module and a switch unit. The switch unit includes a low-side switch unit. The specific composition of the detection circuit is omitted here because it has been described in detail in the foregoing embodiments.

The arrangement of steps in each method described above is merely for clarity of description. During implementation, the steps may be combined into one step or some steps may be divided into a plurality of steps, and the combination and division fall within the protection scope of this patent as long as the same logical relationship is incorporated. Adding insignificant modifications and introducing insignificant design into an algorithm or process herein without changing the core design of the algorithm and process fall within the protection scope of this patent.

A person of ordinary skill in the art understands that the embodiments described above are detailed embodiments for implementing this application. In practical applications, various modifications may be made in form and detail to the embodiments without departing from the spirit and scope of this application.

What is claimed is:

1. A detection circuit of an electrical control device, wherein the detection circuit is configured to detect a drive circuit of the electrical control device, the drive circuit of the electrical control device comprises a drive power module and a low-side switch unit, the drive power module is connected to a first end of the electrical control device, a second end of the electrical control device is connected to a first end of the low-side switch unit, and a second end of the low-side switch unit is grounded; and the detection circuit comprises: a first detection module, a second detection module, and a control module;

a first end of the first detection module is connected to the first end of the electrical control device, a second end of the first detection module is connected to the second end of the electrical control device, a third end of the first detection module is connected to the control module; and a first end of the second detection module is connected to the second end of the electrical control device, a second end of the second detection module is connected to the control module, and a third end of the second detection module is grounded; and the control module is configured to:
obtain an electrical signal at the third end of the first detection module, and determine, based on the electrical signal at the third end of the first detection module, whether the drive circuit of the electrical control device is faulty; or obtain an electrical signal at the second end of the second detection module, and determine, based on the electrical signal at the second end of the second detection module, whether the drive circuit of the electrical control device is faulty; or obtain an electrical signal at the third end of the first detection module and an electrical signal at the second end of the second detection module, and determine, based on the electrical signal at the third end of the first detection module and the electrical signal at the second end of the second detection module, whether the drive circuit of the electrical control device is faulty.

2. The detection circuit of an electrical control device according to claim 1, wherein the detection circuit further comprises a switch module, the switch module is serial-connected between the first end of the first detection module and the first end of the electrical control device.

3. The detection circuit of an electrical control device according to claim 1, wherein the first detection module comprises a first power submodule, a first current-limiting submodule, and a switch element; a first end of the switch element serves as the first end of the first detection module, and a second end of the switch element serves as the second end of the first detection module; and a third end of the switch element is connected to the first power submodule by the first current-limiting submodule, a fourth end of the switch element is grounded, and the third end of the switch element serves as the third end of the first detection module; or a third end of the switch element is connected to the first power submodule, a fourth end of the switch element is connected to a first end of the first current-limiting submodule, a second end of the first current-limiting submodule is grounded, and the first end of the first current-limiting submodule serves as the third end of the first detection module;

wherein, when a current flows from the first end of the switch element to the second end of the switch element, an electrically conductive path is formed between the third end of the switch element and the fourth end of the switch element.

4. The detection circuit of an electrical control device according to claim 3, wherein the detection circuit further comprises a filter module, and the third end of the first detection module is connected to the control module by the filter module.

5. The detection circuit of an electrical control device according to claim 1, wherein the first detection module comprises: a first power submodule, a filter submodule, a first current-limiting submodule, and a switch element; a first end of the switch element serves as the first end of the first detection module, and a second end of the switch element serves as the second end of the first detection module; and a third end of the switch element is connected to the first power submodule by the first current-limiting submodule, a fourth end of the switch element is connected to a first end of the filter submodule, a second end of the filter submodule is grounded, and a third end of the filter submodule serves as the third end of the first detection module.

6. The detection circuit of an electrical control device according to claim 1, wherein the detection circuit further comprises a first current-limiting module; and the first end of the first detection module is connected to the first end of the electrical control device by the first current-limiting module.

7. The detection circuit of an electrical control device according to claim 1, wherein the second detection module comprises a second power submodule, a second current-limiting submodule, and a switch transistor, the second power submodule is connected to a first end of the switch transistor by the second current-limiting submodule, a second end of the switch transistor serves as the third end of the second detection module, a control end of the switch transistor serves as the first end of the second detection module, and the first end of the switch transistor serves as the second end of the second detection module.

8. The detection circuit of an electrical control device according to claim 1, wherein the detection circuit further comprises a second current-limiting module, and the second end of the second detection module is connected to the control module by the second current-limiting module.

9. The detection circuit of an electrical control device according to claim 1, wherein the detection circuit further comprises a freewheeling module, and the freewheeling module is parallel-connected to the electrical control device.

10. The detection circuit of an electrical control device according to claim 1, wherein the control module comprises a processing submodule and a first multiplexing submodule, and the processing submodule is connected to the third end of the first detection module and the second end of the second detection module by the first multiplexing submodule.

11. The detection circuit of an electrical control device according to claim 1, wherein the control module comprises a processing submodule and a second multiplexing submodule, and the processing submodule is connected to the low-side switch unit of the electrical control device by the second multiplexing submodule.

12. A detection method of an electrical control device, wherein the detection method is applied to a control module in the detection circuit of the electrical control device according to claim 1, and the detection method comprises:
obtaining an electrical signal at a third end of a first detection module, and determining, based on the electrical signal at the third end of the first detection module, whether a drive circuit of the electrical control device is faulty; or
obtaining an electrical signal at a second end of a second detection module, and determining, based on the electrical signal at the second end of the second detection module, whether a drive circuit of the electrical control device is faulty; or
obtaining an electrical signal at a third end of a first detection module and an electrical signal at a second end of a second detection module, and determining, based on the electrical signal at the third end of the first detection module and the electrical signal at the second end of the second detection module, whether a drive circuit of the electrical control device is faulty.

13. The detection method of an electrical control device according to claim 12, wherein, when the detection method is applied to a control module in a detection circuit, the "obtaining an electrical signal at a third end of a first detection module and an electrical signal at a second end of a second detection module, and determining, based on the electrical signal at the third end of the first detection module and the electrical signal at the second end of the second detection module, whether a drive circuit of the electrical control device is faulty" specifically comprises:
obtaining a first electrical signal at the second end of the second detection module in a state in which a low-side switch unit is not enabled;
closing the switch module when it is determined that a level of the first electrical signal is not a preset first level, and obtaining a second electrical signal at the third end of the first detection module; and
determining a fault type of the drive circuit of the electrical control device based on the second electrical signal; and
the detection circuit further comprises a switch module, the switch module is serial-connected between the first end of the first detection module and the first end of the electrical control device.

14. The detection method of an electrical control device according to claim 13, wherein the determining a fault type of the drive circuit of the electrical control device based on the second electrical signal specifically comprises:
determining whether a level of the second electrical signal is a preset second level;
determining, if a determining result is that the level of the second electrical signal is the preset second level, that the fault type of the drive circuit of the electrical control device is an open-circuit fault; or
determining, if a determining result is that the level of the second electrical signal is not the preset second level, that the fault type of the drive circuit of the electrical control device is a shorted-to-ground fault.

15. The detection method of an electrical control device according to claim 13, wherein, after closing the switch module, the detection method of an electrical control device further comprises:
obtaining a third electrical signal at the second end of the second detection module; and
the determining a fault type of the drive circuit of the electrical control device based on the second electrical signal specifically comprises:
determining, if it is determined that a level of the second electrical signal is a preset second level, and a level of the third electrical signal is the first level, that the fault type of the drive circuit of the electrical control device is an open-circuit fault; or determining, if it is determined that a level of the second electrical signal is not a preset second level, and a level of the third electrical signal is not the first level, that the fault type of the drive circuit of the electrical control device is a shorted-to-ground fault.

16. The detection method of an electrical control device according to claim 12, wherein the "obtaining an electrical signal at a third end of a first detection module, and determining, based on the electrical signal at the third end of the first detection module, whether a drive circuit of the electrical control device is faulty" specifically comprises:

monitoring the electrical signal at the third end of the first detection module in real time in a state in which the low-side switch unit is enabled and the switch module is closed; and determining, if it is determined that a level of the electrical signal at the third end of the first detection module is not a preset second level, that a power loss fault occurs in the drive circuit of the electrical control device.

17. The detection method of an electrical control device according to claim 12, wherein, when the detection method is applied to a control module in a detection circuit, the "obtaining an electrical signal at a second end of a second detection module, and determining, based on the electrical signal at the second end of the second detection module, whether a drive circuit of the electrical control device is faulty" specifically comprises:

monitoring the electrical signal at the second end of the second detection module in real time in a state in which a low-side switch unit is enabled and the switch module is turned off; and determining, if it is determined that a level of the electrical signal at the second end of the second detection module is a preset first level, that an open-circuit fault occurs in the low-side switch unit; and the detection circuit further comprises a switch module, the switch module is serial-connected between the first end of the first detection module and the first end of the electrical control device.

18. An electric vehicle, comprising an electrochemical device, an electrical control device, and the detection circuit according to claim 1.

* * * * *